US010877092B2

(12) United States Patent
Peschke

(10) Patent No.: US 10,877,092 B2
(45) Date of Patent: Dec. 29, 2020

(54) DIFFERENTIAL SIGNAL MEASUREMENT SYSTEM AND METHOD

(71) Applicant: Rohde & Schwarz GmbH & Co. KG, Munich (DE)

(72) Inventor: Martin Peschke, Vaterstetten (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 344 days.

(21) Appl. No.: 15/911,904

(22) Filed: Mar. 5, 2018

(65) Prior Publication Data

US 2019/0271741 A1  Sep. 5, 2019

(51) Int. Cl.
*G01R 31/317* (2006.01)
*G01R 23/18* (2006.01)
*G01R 19/165* (2006.01)
*G01R 1/067* (2006.01)

(52) U.S. Cl.
CPC ... *G01R 31/31706* (2013.01); *G01R 1/06788* (2013.01); *G01R 19/16557* (2013.01); *G01R 23/18* (2013.01); *G01R 31/31723* (2013.01)

(58) Field of Classification Search
CPC ........ G01R 31/31706; G01R 31/31723; G01R 23/18; G01R 19/16557; G01R 1/06788
USPC .......................................... 324/527; 73/1.82
See application file for complete search history.

(56) References Cited

U.S. PATENT DOCUMENTS 9,618,599 B2 *  4/2017  Dascher ................. G01R 35/00
2016/0033455 A1 *  2/2016  Knierim ................. G01N 29/30
73/1.82

FOREIGN PATENT DOCUMENTS

EP    2853902 A1    4/2015

OTHER PUBLICATIONS

Keysight Technologies, "Understanding Oscilloscope Probe Correction", http://literature.cdn.keysight.com/litweb/pdf/5990-8371EN.pdf, Aug. 1, 2014.
Van Den Bossche, et al., "Two channel high voltage differential probe for power electronics applications", Technology and Engineering, 15th European Conference on Power Electronics and Applications, Proceedings, Article No. 0881-EPE2013, Sep. 3, 2013.

* cited by examiner

*Primary Examiner* — Farhana A Hoque
(74) *Attorney, Agent, or Firm* — Potomac Technology Law, LLC

(57) ABSTRACT

A differential signal measurement system is provided. The differential signal measurement system includes a measurement device, with at least one differential signal input, a differential connection interface configured to connect the at least one differential signal input of the measurement device to a device under test, and a differential signal source, with at least one differential signal output, configured to generate at least one differential output signal. The differential connection interface is further configured to pass the at least one differential output signal to the at least one differential signal input of the measurement device, and the measurement device is configured to capture the at least one differential output signal.

19 Claims, 3 Drawing Sheets

DIFFERENTIAL SIGNAL MEASUREMENT SYSTEM AND METHOD

TECHNICAL FIELD

The invention relates to a differential signal measurement system and a differential signal measurement method for measuring differential signals in an efficient and accurate manner.

BACKGROUND

Generally, in times of an increasing number of applications comprising electrical circuitry providing differential signals, there is a growing need of a differential signal measurement system and a corresponding differential signal measurement method, especially in order to verify the proper functioning of said applications in an efficient and accurate manner.

The document EP2853902A1 relates in general to signal acquisition systems, and more particularly, to a de-embed probe with switched loads and an internal signal generator for reducing measurement errors due to the probe tip loading of a device under test. As it can be seen, said de-embed probe does not allow for detecting or reducing measurement errors especially going beyond those due to probe tip loading.

Accordingly, there is a need for a differential signal measurement system and a differential signal measurement method for measuring differential signals in an efficient and accurate manner, thereby reducing measurement errors with respect to the major parts of the measurement system.

SOME EXAMPLE EMBODIMENTS

Embodiments of the present invention advantageously address the foregoing requirements and needs, as well as others, by providing a differential signal measurement system and a differential signal measurement method for measuring differential signals in an efficient and accurate manner, thereby reducing measurement errors with respect to the major parts of the measurement system.

According to a first aspect of the invention, a differential signal measurement system is provided. The system comprises a measurement device including at least one differential signal input, a differential connection unit configured to allow for connecting the at least one differential signal input of the measurement device to a device under test, and a differential signal source including at least one differential signal output configured to generate at least one differential output signal. In this context, the differential connection unit is further configured to pass the at least one differential output signal to the at least one differential signal input of the measurement device, and the measurement device is configured to capture the at least one differential output signal. Advantageously, measurement errors with respect to major parts of the measurement system can be detected.

According to a first implementation form of the differential signal measurement system, the measurement system further comprises a differential filtering unit being connectable to the at least one differential signal input of the measurement device. Further, the differential filtering unit is configured to compensate signal errors caused by the differential connection unit and/or by the at least one differential signal input with respect to the at least one differential output signal captured by the measurement device. Advantageously, measurement errors with respect to major parts of the measurement system can be reduced.

According to a further implementation form of the differential signal measurement system, the measurement device comprises an oscilloscope, a logic analyzer, a spectrum analyzer, or any combination thereof. Advantageously, many different measurement devices can be used.

According to a further implementation form of the differential signal measurement system, the at least one differential signal input comprises two single-ended signal inputs. Additionally or alternatively, the at least one differential signal output comprises two single-ended signal outputs. Advantageously, single-ended signals can be used.

According to a further implementation form of the differential signal measurement system, the two single-ended signal inputs comprise different return loss and/or insertion loss. Advantageously, differences in return loss or insertion loss, respectively, are taken into consideration.

According to a further implementation form of the differential signal measurement system, the differential connection unit comprises two cables, such as twisted-pair or triax cables. Advantageously, measurement errors especially caused by cables can be detected or reduced, respectively.

According to a further implementation form of the differential signal measurement system, the at least one differential output signal comprises at least one differential pulse, at least one sine-wave, or any combination thereof. Additionally or alternatively, the at least one differential output signal comprises two single-ended signals with known time relation in parallel or one after another. Advantageously, different waveforms can be used.

According to a further implementation form of the differential signal measurement system, the at least one differential output signal comprises at least one differential signal portion, at least one common-mode signal portion, at least one positive single-ended signal portion, at least one negative single-ended signal portion, or any combination thereof. Advantageously, various signal portions are taken into consideration.

According to a further implementation form of the differential signal measurement system, the differential filtering unit comprises at least one digital filter based on at least one filter coefficient. In this context, the measurement device is further configured to measure a positive signal portion and a negative signal portion of at least one differential input signal at the at least one differential signal input. Additionally, the measurement device is further configured to determine an individual error with respect to the positive signal portion and the negative signal portion of the at least one differential input signal. Additionally, the measurement device is further configured to minimize the individual error by adjusting the at least one filter coefficient. Advantageously, measurement accuracy can be increased.

According to a further implementation form of the differential signal measurement system, the differential filtering unit comprises at least one digital filter based on at least one filter coefficient. In this context, the measurement device is further configured to measure a common-mode signal portion of at least one differential input signal at the at least one differential signal input. Additionally, whereas the measurement device is further configured to determine an individual error with respect to the common-mode signal portion of the at least one differential input signal, the measurement device is additionally configured to minimize the individual error by adjusting the at least one filter coefficient. Advantageously, measurement errors can be reduced.

According to a further implementation form of the differential signal measurement system, the measurement system further comprises an additional differential filtering unit.

Additionally, the differential filtering unit comprises at least one digital filter based on at least one filter coefficient, and the additional differential filtering unit comprises at least one additional digital filter based on at least one additional filter coefficient. In this context, the measurement device is further configured to measure a positive signal portion and a negative signal portion of at least one differential input signal at the at least one differential signal input and to measure a common-mode signal portion of the at least one differential input signal at the at least one differential signal input. Additionally, the measurement device is further configured to determine an individual error with respect to the positive signal portion and the negative signal portion of the at least one differential input signal and to determine an additional individual error with respect to the common-mode signal portion of the at least one differential input signal. Additionally, the measurement device is further configured to minimize the individual error and the additional individual error by adjusting the at least one filter coefficient and the at least one additional filter coefficient. Advantageously, measurement accuracy can be further increased.

According to a second aspect of the invention, a differential signal measurement method is provided. The method comprises the steps of generating at least one differential output signal with the aid of a differential signal source including at least one differential signal output, passing the at least one differential output signal to at least one differential signal input of a measurement device with the aid of a differential connection unit, and capturing the at least one differential output signal with the aid of the measurement device. Advantageously, measurement errors with respect to major parts can be detected.

According to a first implementation form of the differential signal measurement method, the measurement method further comprises the steps of connecting a differential filtering unit to the at least one differential signal input of the measurement device, and compensating signal errors caused by the differential connection unit and/or by the at least one differential signal input with respect to the at least one differential output signal captured by the measurement device with the aid of the differential filtering unit. Advantageously, measurement errors with respect to major parts can be reduced.

According to a further implementation form of the differential signal measurement method, the measurement method further comprises the step of using an oscilloscope, a logic analyzer, a spectrum analyzer, or any combination thereof as the measurement device. Advantageously, many different measurement devices can be used.

According to a further implementation form of the differential signal measurement method, the measurement method further comprises the step of using two cables, such as twisted-pair or triax cables, at least as a part of the differential connection unit. Advantageously, measurement errors especially caused by cables can be detected or reduced, respectively.

According to a further implementation form of the differential signal measurement method, the measurement method further comprises the steps of measuring a positive signal portion and a negative signal portion of at least one differential input signal at the at least one differential signal input, determining an individual error with respect to the positive signal portion and the negative signal portion of the at least one differential input signal, and minimizing the individual error by adjusting at least one filter coefficient of at least one digital filter of a differential filtering unit. Advantageously, measurement errors can be reduced.

According to a further implementation form of the differential signal measurement method, the measurement method further comprises the steps of measuring a common-mode signal portion of at least one differential input signal at the at least one differential signal input, determining an individual error with respect to the common-mode signal portion of the at least one differential input signal, and minimizing the individual error by adjusting at least one filter coefficient of at least one digital filter of a differential filtering unit. Advantageously, measurement accuracy can be increased.

According to a further implementation form of the differential signal measurement method, the measurement method further comprises the steps of measuring a positive signal portion and a negative signal portion of at least one differential input signal at the at least one differential signal input and measuring a common-mode signal portion of the at least one differential input signal at the at least one differential signal input, determining an individual error with respect to the positive signal portion and the negative signal portion of the at least one differential input signal and determining an additional individual error with respect to the common-mode signal portion of the at least one differential input signal, and minimizing the individual error by adjusting at least one filter coefficient of at least one digital filter of a differential filtering unit and minimizing the additional individual error by adjusting at least one additional filter coefficient of at least one additional digital filter of an additional differential filtering unit. Advantageously, measurement errors can further be reduced.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

Embodiments of the present invention are illustrated by way of example, and not by way of limitation, in the figures of the accompanying drawings, in which like reference numerals refer to similar elements, and in which.

DETAILED DESCRIPTION

A differential signal measurement system and a differential signal measurement method for measuring differential signals in an efficient and accurate manner, which achieve a reduction of measurement errors with respect to the major parts of the measurement system, are described. In the following description, for the purposes of explanation, numerous specific details are set forth in order to provide a thorough understanding of the invention. It is apparent, however, that the invention may be practiced without these specific details or with an equivalent arrangement. In other instances, well-known structures and devices are shown in block diagram form in order to avoid unnecessarily obscuring the invention.

A processor, unit, module or component (as referred to herein) may be composed of software component(s), which are stored in a memory or other computer-readable storage medium, and executed by one or more processors or CPUs of the respective devices. A module or unit may alternatively be composed of hardware component(s) or firmware component(s), or a combination of hardware, firmware and/or software components. Further, with respect to the various example embodiments described herein, while certain of the functions are described as being performed by certain components or modules (or combinations thereof), such descriptions are provided as examples and are thus not intended to be limiting. Accordingly, any such functions may be envisioned as being performed by other components or modules (or combinations thereof), without departing from the spirit and general scope of the present invention. Moreover, the methods, processes and approaches described herein may be processor-implemented using processing circuitry that may comprise one or more microprocessors, application specific integrated circuits (ASICs), field programmable gate arrays (FPGAs), or other devices operable to be configured or programmed to implement the systems and/or methods described herein. For implementation on such devices that are operable to execute software instructions, the flow diagrams and methods described herein may be implemented in processor instructions stored in a computer-readable medium, such as executable software stored in a computer memory store.

Figure 1:
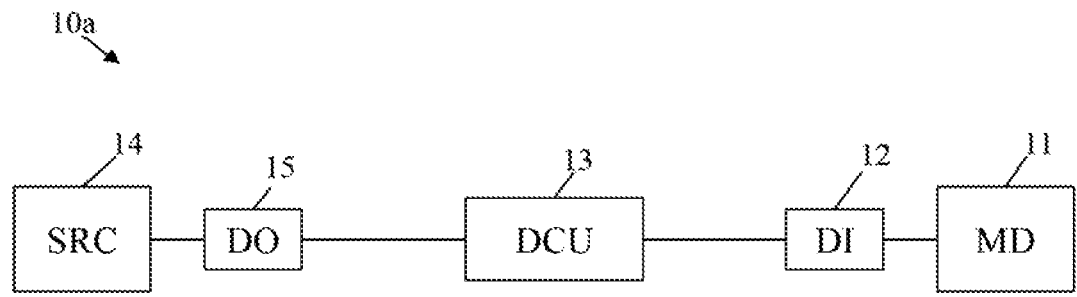
FIG. 1 shows a first example differential signal measurement system according to example embodiments of the present invention.

FIG. 1 shows a first example differential signal measurement system 10a according to example embodiments of the present invention. The differential signal measurement system 10a comprises a measurement device 11, which includes a differential signal input 12, a differential connection unit 13, and a differential signal source 14, which includes a differential signal output 15 configured to generate at least one differential output signal. The differential connection unit 13 is configured to connect the differential signal input 12 of the measurement device 11 to a device under test. The differential connection unit 13 is configured to pass the at least one differential output signal to the differential signal input 12 of the measurement device 11. Further, the measurement device 11 is configured to capture the at least one differential output signal.

By way of example, the measurement device 11 may comprise an oscilloscope, a logic analyzer, a spectrum analyzer, or any combination thereof.

By way of further example, the differential signal input 12 may comprise two single-ended signal inputs. By way of further example, the differential signal output 15 may comprise two single-ended signal outputs. By way of further example, the two single-ended signal inputs may comprise different return loss and/or insertion loss, and the two single-ended signal outputs may comprise different return loss and/or insertion loss.

By way of further example, the differential connection unit 13 may comprise two cables, such as twisted-pair or triax cables.

By way of further example, the at least one differential output signal may comprise at least one differential pulse, at least one sine-wave, or any combination thereof. By way of further example, the at least one differential output signal may comprise two single-ended signals with known time relation in parallel or sequentially.

By way of further example, the at least one differential output signal may comprise at least one differential signal portion, at least one common-mode signal portion, at least one positive single-ended signal portion, at least one negative single-ended signal portion, or any combination thereof.

Figure 2:
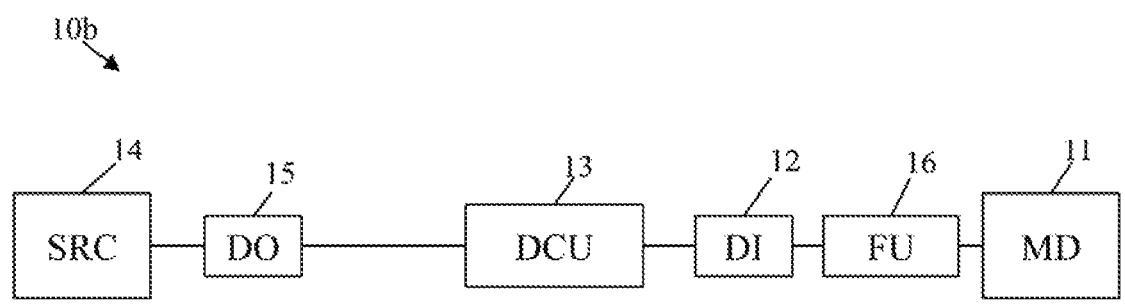
FIG. 2 shows a second example differential signal measurement system according to example embodiments of the present invention.

FIG. 2 shows a second example differential signal measurement system 10b according to example embodiments of the present invention. FIG. 2 shows the measurement system 10a of FIG. 1, further comprising a differential filtering unit 16 being connectable to the differential signal input 12 of the measurement device 11. By way of example, the differential filtering unit 16 may be configured to compensate signal errors caused by the differential connection unit 13 and/or by the differential signal input 12 with respect to the at least one differential output signal captured by the measurement device 11.

By way of further example, the differential filtering unit 16 may comprise at least one digital filter based on at least one filter coefficient.

By way of further example, the measurement device 11 may be further configured to measure a positive signal portion and a negative signal portion of at least one differential input signal at the differential signal input 12. By way of further example, the measurement device 11 may be further configured to measure a common-mode signal portion of at least one differential input signal at the differential signal input 12.

By way of further example, the measurement device 11 may be further configured to determine an individual error with respect to the positive signal portion and the negative signal portion of the at least one differential input signal. By way of further example, the measurement device 11 may be further configured to determine the individual error with respect to the common-mode signal portion of the at least one differential input signal.

By way of further example, the measurement device 11 may be further configured to minimize said individual error by adjusting the at least one filter coefficient.

Figure 3:
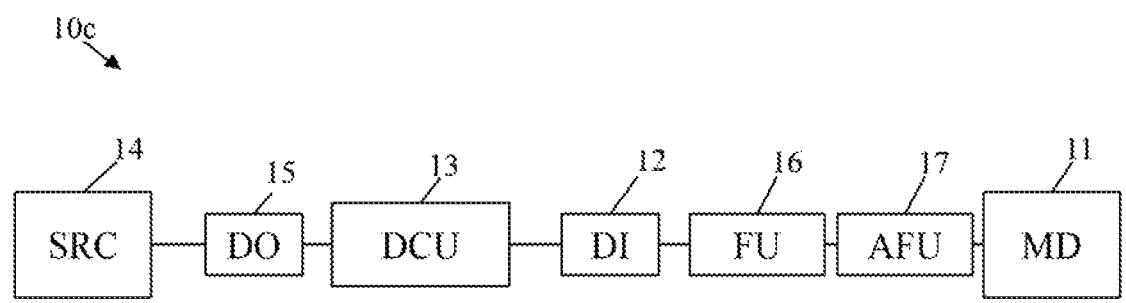
FIG. 3 shows a third example differential signal measurement system according to example embodiments of the present invention.

FIG. 3 shows a third example differential signal measurement system 10c according to example embodiments of the present invention. FIG. 3 shows the measurement system 10b of FIG. 2, further comprising an additional differential filtering unit 17. By way of example, the additional differential filtering unit 17 comprises at least one additional digital filter based on at least one additional filter coefficient.

By way of further example, the measurement device 11 may be further configured to measure a positive signal portion and a negative signal portion of at least one differential input signal at the differential signal input 12 and to measure a common-mode signal portion of the at least one differential input signal at the differential signal input 12.

By way of further example, the measurement device 11 may be further configured to determine an individual error with respect to the positive signal portion and the negative signal portion of the at least one differential input signal and to determine an additional individual error with respect to the common-mode signal portion of the at least one differential input signal.

By way of further example, the measurement device 11 may be further configured to minimize said individual error and said additional individual error by adjusting the at least one filter coefficient and the at least one additional filter coefficient.

Figure 4:
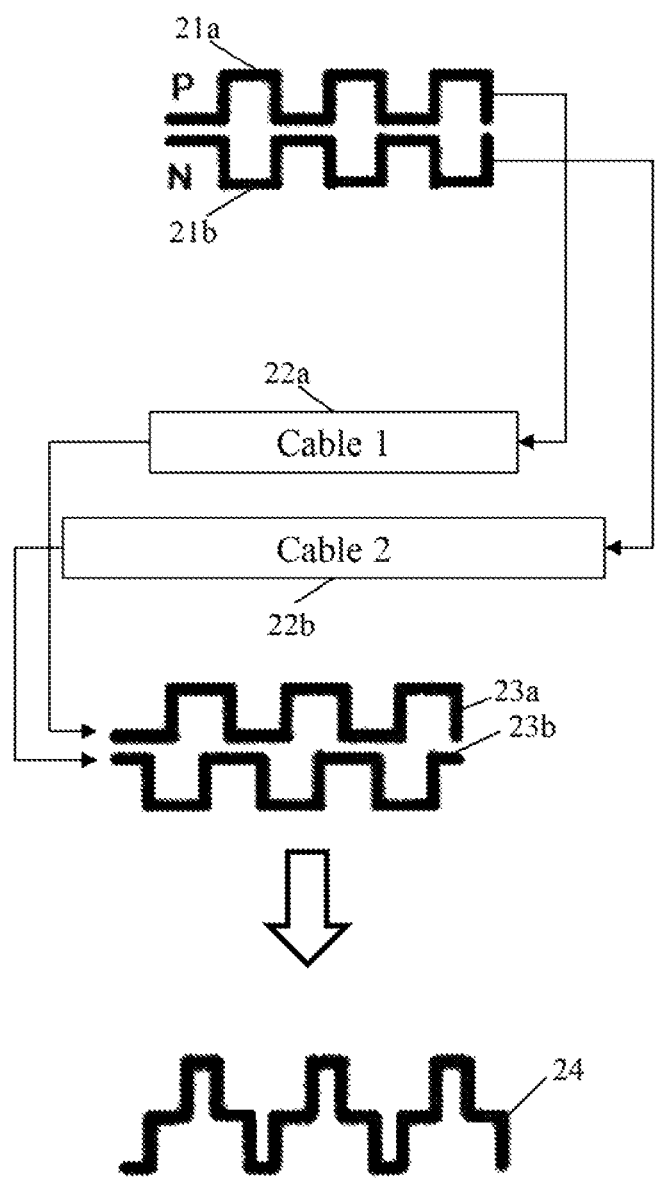
FIG. 4 shows an example case of measurement errors caused by the differential connection unit, for example, comprising cables of different lengths.

FIG. 4 shows an example case of measurement errors caused by the differential connection unit 13, for example, comprising cables 22a, 22b of different lengths. In this context, as an example of the at least one differential output signal generated by the differential signal output 15, a differential signal comprising a positive signal portion 21a and a negative signal portion 21b is provided.

By way of example, after passing through the two cables 22a, 22b, the differential signal becomes skewed with positive and negative signal portions 23a, 23b due to the different lengths of the two cables 22a, 22b, which results in an example differential measurement signal 24. In other words, the different lengths of the cables 22a, 22b results in an error signal at the cable outputs. For instance, the rising positive pulse may be delayed with respect to the falling negative pulse, which may cause the respective differential signal to have a slower rise time or even an intermediate state. By way of further example, additional reasons for at least one error signal at the output of the differential connection unit or the cables 22a, 22b, respectively, may be that the cables may comprise different losses or that the respective two single-ended signal inputs of the measurement device may comprise different gain and/or frequency responses and/or different return losses or reflection coefficients, respectively. Further, with respect to said different reflection coefficients, signals reflected by the single-ended signal inputs of the measurement device, for example, cause echoes that may look different at the inputs thus generating an error signal.

In this context, the inventive error compensation process is explained in further detail, as follows. The measurement device may use the differential signal source (including at least one differential signal output), such as a built-in differential signal source (including at least one differential signal output), in order to compensate for errors (e.g., length and frequency response) of the differential connection unit (e.g., the two cables), and/or of the at least one differential signal input (e.g., the at least two single-ended signal inputs), of the measurement device.

Further, before a differential measurement is taken, the differential connection unit (e.g., both cables) may be connected to the at least one differential output (e.g., to the at least two single-ended signal outputs thereof) of the differential signal source (e.g., the built-in differential signal source of the measurement device).

Subsequently, the differential signal source may generate at least one differential output signal, for instance, a differential sine-wave or differential pulse signal.

Further, the measurement device may be configured to perform an automatic adjustment for both channels individually, and/or a dedicated symmetry adjustment by using the differential filtering unit and/or the additional differential filtering unit, for example, being part of the measurement device.

As an advantage, in this manner, in contrast to deskewing, not only can correction of a basic group delay be achieved, but rather correction of the whole respective frequency response.

As a further advantage, no costly and often lost matched pair cables are necessary. In this context, the symmetry of the differential signal source is much better than that of a matched cable, such as a few hundred femtoseconds (e.g., between 100 fs and 900 fs, or between 200 fs and 600 fs, or between 270 fs and 430 fs).

As a further advantage, the whole measurement system can be corrected, including the at least one differential signal input of the measurement device, and a dedicated symmetry correction is possible (rather than two separate channel corrections).

As a further advantage, the process achieves improved speed and efficiency, and can be easily performed before a differential measurement is taken. As a further advantage, no external equipment is needed, for example, in the case of a built-in differential signal source and differential filtering units being part of the measurement device. As a further advantage, no manual entries are necessary if the error correction or compensation, respectively, is automated.

Figure 5:
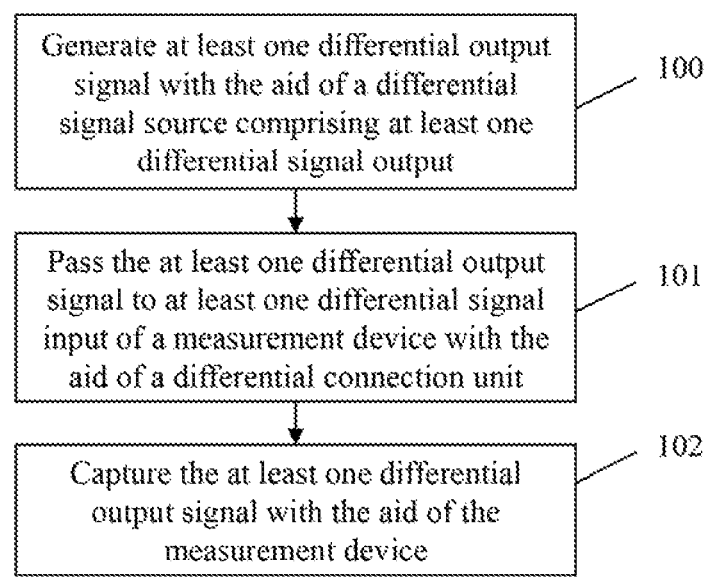
FIG. 5 shows a flow chart depicting and example differential signal measurement method according to example embodiments of the present invention.

FIG. 5 shows a flow chart depicting and example differential signal measurement method according to example embodiments of the present invention. In step 100, at least one differential output signal is generated with the aid of a differential signal source comprising at least one differential signal output. In step 101, the at least one differential output signal is passed to at least one differential signal input of a measurement device with the aid of a differential connection unit. In step 102, the at least one differential output signal is captured with the aid of the measurement device.

The measurement method may further comprise the steps of connecting a differential filtering unit to the at least one differential signal input of the measurement device, and compensating signal errors caused by the differential connection unit and/or by the at least one differential signal input with respect to the at least one differential output signal captured by the measurement device with the aid of said differential filtering unit.

The measurement method may further comprise the step of using an oscilloscope, a logic analyzer, a spectrum analyzer, or any combination thereof as the measurement device.

The measurement method may further comprise the step of using two cables, such as twisted-pair or triax cables, at least as a part of the differential connection unit.

The measurement method may further comprise the steps of measuring a positive signal portion and a negative signal portion of at least one differential input signal at the at least one differential signal input, determining an individual error with respect to the positive signal portion and the negative signal portion of the at least one differential input signal, and minimizing said individual error by adjusting at least one filter coefficient of at least one digital filter of a differential filtering unit.

The measurement method may further comprise the steps of measuring a common-mode signal portion of at least one differential input signal at the at least one differential signal input, determining an individual error with respect to the common-mode signal portion of the at least one differential input signal, and minimizing said individual error by adjusting at least one filter coefficient of at least one digital filter of a differential filtering unit.

The measurement method may further comprise the steps of measuring a positive signal portion and a negative signal portion of at least one differential input signal at the at least one differential signal input and measuring a common-mode signal portion of the at least one differential input signal at the at least one differential signal input, determining an individual error with respect to the positive signal portion and the negative signal portion of the at least one differential input signal and determining an additional individual error with respect to the common-mode signal portion of the at least one differential input signal, and minimizing said individual error by adjusting at least one filter coefficient of at least one digital filter of a differential filtering unit and minimizing said additional individual error by adjusting at least one additional filter coefficient of at least one additional digital filter of an additional differential filtering unit.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A differential signal measurement system comprising:
a measurement device comprising at least one differential signal input;
a differential connection interface configured to connect the at least one differential signal input of the measurement device to a device under test;
a differential signal source, comprising at least one differential signal output, configured to generate at least one differential output signal;
a first differential filter; and
a second differential filter; and
wherein the differential connection interface is further configured to pass the at least one differential output signal to the at least one differential signal input of the measurement device,
wherein the measurement device is configured to capture the at least one differential output signal, and
wherein the measurement device is further configured to perform a dedicated symmetry adjustment by using one or more of the first differential filter and the second differential filter.

2. The measurement system according to claim 1, wherein the first differential filter is configured to be connected to the at least one differential signal input of the measurement device, and to compensate signal errors caused by one or more of the differential connection interface and the at least one differential signal input, with respect to the at least one differential output signal captured by the measurement device.

3. The measurement system according to claim 1, wherein the measurement device comprises one or more of an oscilloscope, a logic analyzer, and a spectrum analyzer.

4. The measurement system according to claim 1, wherein the at least one differential signal input comprises two single-ended signal inputs, and/or the at least one differential signal output comprises two single-ended signal outputs.

5. The measurement system according to claim 4, wherein the two single-ended signal inputs comprise one or more of a different return loss and a different insertion loss.

6. The measurement system according to claim 1, wherein the differential connection interface comprises two cables comprising one of twisted-pair cables and triax cables.

7. The measurement system according to claim 1, wherein the at least one differential output signal comprises one or more of at least one differential pulse and at least one sine-wave, and/or the at least one differential output signal comprises two parallel or sequential single-ended signals with known time relation.

8. The measurement system according to claim 1, wherein the at least one differential output signal comprises one or more of at least one differential signal portion, at least one common-mode signal portion, at least one positive single-ended signal portion, and at least one negative single-ended signal portion.

9. The measurement system according to claim 2:
wherein the first differential filter is configured based on at least one filter coefficient; and
wherein the measurement device is further configured to measure a positive signal portion and a negative signal portion of at least one differential input signal at the at least one differential signal input, to determine an individual error with respect to the positive signal portion and the negative signal portion of the at least one differential input signal, and to minimize the individual error by adjusting the at least one filter coefficient.

10. The measurement system according to claim 2:
wherein the first differential filter is configured based on at least one filter coefficient; and
wherein the measurement device is further configured to measure a common-mode signal portion of at least one differential input signal at the at least one differential signal input, to determine an individual error with respect to the common-mode signal portion of the at least one differential input signal, and to minimize the individual error by adjusting the at least one filter coefficient.

11. The measurement system according to claim 2,
wherein the first differential filter is configured based on at least one filter coefficient,
wherein the second differential filter is configured based on at least one additional filter coefficient, and
wherein the measurement device is further configured to measure a positive signal portion and a negative signal portion of at least one differential input signal at the at least one differential signal input, and to measure a common-mode signal portion of the at least one differential input signal at the at least one differential signal input.

12. The measurement system according to claim 11, wherein the measurement device is further configured to determine an individual error with respect to the positive signal portion and the negative signal portion of the at least one differential input signal, to determine an additional individual error with respect to the common-mode signal portion of the at least one differential input signal, and to minimize the individual error and the additional individual error by adjusting the at least one filter coefficient and the at least one additional filter coefficient.

13. A differential signal measurement method comprising:
generating, by a differential signal source via at least one differential signal output, at least one differential output signal;
forwarding the at least one differential output signal to at least one differential signal input of a measurement device via a differential connection interface;

capturing, by the measuring device, the at least one differential output signal; and performing a dedicated symmetry adjustment by using one or more of a first differential filter and a second differential filter of the measurement device.

14. The measurement method according to claim 13, further comprising:

compensating, via the first differential filter connected to the at least one differential signal input of the measurement device, signal errors caused by one or more of the differential connection interface and the at least one differential signal input, with respect to the at least one differential output signal captured by the measurement device.

15. The measurement method according to claim 13, wherein the measurement device comprises one or more of an oscilloscope, a logic analyzer, and a spectrum analyzer.

16. The measurement method according to claim 13, wherein the differential connection interface comprises two cables comprising one of twisted-pair cables and triax cables.

17. The measurement method according to claim 14, further comprising:

measuring, by the measuring device, a positive signal portion and a negative signal portion of at least one differential input signal at the at least one differential signal input;

determining an individual error with respect to the positive signal portion and the negative signal portion of the at least one differential input signal; and minimizing the individual error by adjusting at least one filter coefficient of the first differential filter.

18. The measurement method according to claim 14, further comprising:

measuring, by the measuring device, a common-mode signal portion of at least one differential input signal at the at least one differential signal input;

determining an individual error with respect to the common-mode signal portion of the at least one differential input signal; and minimizing the individual error by adjusting at least one filter coefficient of the first differential filter.

19. The measurement method according to claim 14, further comprising:

measuring, by the measuring device, a positive signal portion and a negative signal portion of at least one differential input signal at the at least one differential signal input, and measuring, by the measuring device, a common-mode signal portion of the at least one differential input signal at the at least one differential signal input;

determining an individual error with respect to the positive signal portion and the negative signal portion of the at least one differential input signal, and determining an additional individual error with respect to the common-mode signal portion of the at least one differential input signal; and minimizing the individual error by adjusting at least one filter coefficient of the first differential filter, and minimizing the additional individual error by adjusting at least one additional filter coefficient of the second differential filter.

* * * * *